(12) United States Patent
Pisek et al.

(10) Patent No.: US 7,856,611 B2
(45) Date of Patent: Dec. 21, 2010

(54) RECONFIGURABLE INTERCONNECT FOR USE IN SOFTWARE-DEFINED RADIO SYSTEMS

(75) Inventors: Eran Pisek, Plano, TX (US); Jasmin Oz, Plano, TX (US); Yan Wang, Plano, TX (US)

(73) Assignee: Samsung Electronics Co., Ltd., Suwon-si (KR)

( * ) Notice: Subject to any disclaimer, the term of this patent is extended or adjusted under 35 U.S.C. 154(b) by 388 days.

(21) Appl. No.: 11/142,484

(22) Filed: Jun. 1, 2005

(65) Prior Publication Data

US 2006/0184910 A1      Aug. 17, 2006

Related U.S. Application Data

(63) Continuation-in-part of application No. 11/123,313, filed on May 6, 2005, now Pat. No. 7,668,992.

(60) Provisional application No. 60/653,968, filed on Feb. 17, 2005, provisional application No. 60/653,856, filed on Feb. 17, 2005.

(51) Int. Cl.
*H03K 17/693*  (2006.01)
*H03K 19/00*   (2006.01)
*G06F 17/50*   (2006.01)

(52) U.S. Cl. .............................. 716/16; 716/14; 716/17

(58) Field of Classification Search .................. 716/14, 716/17, 16
See application file for complete search history.

(56) References Cited

U.S. PATENT DOCUMENTS

| | | | |
|---|---|---|---|
| 5,892,966 A | | 4/1999 | Petrick et al. |
| 6,298,471 B1 * | | 10/2001 | Schreiber ..................... 716/10 |
| 6,694,501 B2 * | | 2/2004 | Chang et al. .................. 716/10 |
| 6,698,002 B2 * | | 2/2004 | Chang et al. .................... 716/4 |
| 6,904,550 B2 * | | 6/2005 | Sibecas et al. ............... 714/714 |
| 7,080,341 B2 * | | 7/2006 | Eisenstadt et al. ............. 716/13 |
| 7,093,225 B2 * | | 8/2006 | Osann .......................... 716/19 |
| 2003/0018738 A1 * | | 1/2003 | Boylan et al. ................ 709/213 |
| 2004/0063425 A1 * | | 4/2004 | Wakutsu et al. .............. 455/418 |
| 2004/0139428 A1 | | 7/2004 | Chuang et al. |
| 2004/0224647 A1 | | 11/2004 | Ma et al. |
| 2004/0242261 A1 | | 12/2004 | Fette |

(Continued)

OTHER PUBLICATIONS

Wai-Kwong Lee, et al., "Finite State Machine Partitioning for Low Power", 1999 IEEE, p. I-306-I-309.

(Continued)

*Primary Examiner*—Vuthe Siek
*Assistant Examiner*—Patrick Sandoval

(57) ABSTRACT

A method of fabricating an interconnect circuit for coupling a plurality of reconfigurable component blocks that implement a defined function. The method comprises the steps of: 1) determining P possible configurations for implementing the defined function; 2) for each of the P possible configuration, determining a list of required interconnections between the plurality of reconfigurable component blocks; 3) determining from the P lists of required interconnections a minimum number, B, of data buses required to implement the P possible configurations for the defined function; 4) for each of the P possible configurations, determining the interconnections of each of the plurality of reconfigurable component blocks to each of the B buses; and 5) implementing programmable switches capable of coupling a first reconfigurable component block to a first bus only if required to implement at least one of the P possible configurations.

20 Claims, 9 Drawing Sheets

U.S. PATENT DOCUMENTS

| | | | |
|---|---|---|---|
| 2005/0039185 | A1 | 2/2005 | Heidari-Bateni et al. |
| 2005/0091629 | A1* | 4/2005 | Eisenstadt et al. ............. 716/13 |
| 2005/0097306 | A1* | 5/2005 | Gajski ........................ 712/245 |
| 2005/0256969 | A1 | 11/2005 | Yancey et al. |
| 2006/0211387 | A1 | 9/2006 | Pisek et al. |
| 2006/0265681 | A1* | 11/2006 | Bakir et al. ................... 716/10 |
| 2007/0054662 | A1 | 3/2007 | Dillinger et al. |

OTHER PUBLICATIONS

Kentaro Ikemoto, et al., "Adaptive Channel Coding Schemes Using Finite State Machine for Software Defined Radio", 2002 IEEE, p. 1029-1033.

Jorg Brakensiek, et al., "Software Radio Approach for Re-Configurable Multi-Standard Radios", 2002 IEEE, p. 110-114.

Luca Benini, et al., "Automatic Synthesis of Low-Power Gated-Clock Finite-State Machines", IEEE Transactions on Computer-Aided Design of Integrated Circuits and Systems, vol. 15, No. 6, Jun. 1996, p. 630-643.

Jose C. Monteiro, et al., "Finite State Machine Decomposition for Low Power", 35th Conference on Design Automation Conference (DAC'98), 1998, p. 758-763.

Data Sheet, "P82B96, Dual bi-directional bus buffer", Philips, Mar. 26, 2004, 16 pages.

Wayne H. Wolf, "Computer as Components: Principles of embedded computing system design", Morgan Kaufman, 2001, p. 453-455.

Daniel D. Gajski, "NISC: The Ultimate Reconfigurable Component", 2003, 14 pages.

Heiko Lehr, "Modeling Custom Hardware in VHDL", Technical Report ICS-99-29, Jul. 6, 1999, 159 pages.

* cited by examiner

| EVENT | CURRENT STATE | | | | | | | | | |
|---|---|---|---|---|---|---|---|---|---|---|
| | START | S1 | S2 | S3 | S4 | S5 | S6 | S7 | S8 | S9 | S10 |
| E1 | S1 | S9 | S4 | S2 | | | | | | | S8 |
| E2 | | S2 | | S2 | S4 | | | | S10 | | |
| E3 | | S2 | | S5 | | | | | | | S8 |
| E4 | | S10 | | | | | | S9 | | | |
| E5 | | | S9 | | S9 | S3 | S9 | | | S10 | S7 |
| E6 | | | | | S2 | | S5 | | | | |
| E7 | | | | S2 | | | S5 | S6 | | | STOP |

RECONFIGURABLE INTERCONNECT FOR USE IN SOFTWARE-DEFINED RADIO SYSTEMS

CROSS-REFERENCE TO RELATED APPLICATIONS AND CLAIM OF PRIORITY

The present invention is related to those disclosed in U.S. Prov. Pat. No. 60/653,968, filed Feb. 17, 2005, entitled "Context-Based Operation Reconfigurable Instruction Set Processor", and U.S. Prov. Pat. No. 60/653,856, filed Feb. 17, 2005, entitled "Reconfigurable Interconnect for Software-Defined Radio". Prov. Pat. Nos. 60/653,968 and 60/653,856 are assigned to the assignee of the present application and are incorporated by reference into the present disclosure. The present application claims priority under 35 U.S.C. §119(e) to U.S. Provisional Pat. Nos. 60/653,968 and 60/653,856.

The present application is a continuation-in-part of U.S. patent application Ser. No. 11/123,313, filed on May 6, 2005 now U.S. Pat. No. 7,668,992, entitled "Context-based Operation Reconfigurable Instruction Set Processor and Method of Operation." application Ser. No. 11/123,313 is assigned to the assignee of the present application and is incorporated by reference into the present application as if fully set forth herein. The present application claims priority under 35 U.S.C. §120 to U.S. patent application Ser. No. 11/123,313.

TECHNICAL FIELD OF THE INVENTION

The present invention relates generally to wireless communication devices and, more specifically, to an interconnect for use in software-defined radio (SDR) communication devices.

BACKGROUND OF THE INVENTION

Data processors are used in nearly every type of modern electronic device, including consumer electronics, industrial machinery, scientific apparatuses and communication networks. However, the performance and degree of complexity of the data processors (or microprocessors) used in different applications may vary widely. The speed and power requirements of a particular application are important in determining the type of data processor used.

The type of data processor used is particularly important in software-defined radio (SDR) implementations. An SDR device uses reconfigurable hardware that may be programmed over the air to operate under different wireless protocols. For example, an SDR transceiver in a wireless laptop computer may be configured by a first software load to operate in an IEEE-802.11x wireless network and may be reconfigured by a second software load to operate in a CDMA2000 wireless network.

There are six main types of data processors in common use: 1) digital signal processors, 2) reduced instruction set computers, 3) complex instruction set computers, 4) field programmable gate arrays, 5) application specific integrated circuits, and 6) application specific instruction set processors. Each of these types of data processors has particular advantages and particular disadvantages.

A digital signal processor (DSP) is a general-purpose processor optimized to efficiently execute digital signal processing operations, such as a Multiply-Accumulate operation for finite impulse response (FIR) filtering and Fast Fourier Transform (FFT) operations. A DSP implements many sophisticated addressing modes to cover many of the DSP calculation requirements, such as bit reverse addressing mode for FFT, index addressing for FIFO devices, and the like. Examples of DSPs include: 1) the Motorola 56000, 56300, SC81xx, and MRC6011 processors; 2) the Texas Instruments (TI) C55, C6203, C6416, and C67xx processors; 3) the ADI Sharc and TigerSharc processors; and 4) the Morpho MS1-64 Reconfigurable DSP.

A reduced instruction set computer (RISC) is a general purpose processor (GPP) that mainly targets control applications, such as media access control (MAC) applications. The main advantage of the RISC machine is its simplicity. As its name suggests, a RISC processor has small instruction set, which provides more code density as well as faster change-of-flow reaction. Examples of RISC devices include: 1) ARM processors (e.g., ARM926, ARM1136J); 2) MIPS processors (e.g., MIPS32, MIPS64); 3) the IBM PowerPC 405 and 750FX; and 4) the Motorola PowerPC 603.

A complex instruction set computer (CISC) device is a general purpose processor (GPP) targeted to the general purpose applications ranging from multimedia applications to PC applications. Examples of CISC processors include: 1) the Intel Pentium; and 2) the Motorola 68000.

The field programmable gate array (FPGA) is a reconfigurable hardware device based on an array of hardware cells connected through long busses and local busses. FPGA devices are quite commonly used in wireless network base station applications and prototypes. Examples of FPGA devices include: 1) the Xilinx Virtex IV; and 2) the Altera Stratix II.

An application specific integrated circuit (ASIC) is a hardware device specially designed for a specific application. An ASIC is usually very power efficient. ASIC devices are used in many wireless devices (i.e., cell phones, etc.). An application specific instruction set processor (ASIP) is an enhanced version of an ASIC device that adds more programmability to the ASIC hardware.

Each of the above-described processors has certain advantages and suffers from particular disadvantages. Digital signal processors are the most flexible type of processor, from a software point of view, in order to meet software-defined radio (SDR) requirements. However, DSP devices do not have enough MIPS performance and bit manipulation architecture to meet 3 G and 4 G bit-rate processing requirements. RISC processors target control applications, but are inadequate beyond baseband applications for wireless network implementations. CISC processors may have the flexibility and the MIPS performance to process baseband applications, but their poor power efficiency makes them unsuitable for handset power restrictions. FPGA devices, like CISC processors, may meet the required MIPS performance, but their poor power efficiency makes them unsuitable for handset designs.

ASIC devices are well matched to the power and cost restrictions of handset designs. However, their flexibility is too limited to make them suitable for SDR implementations. ASIP devices achieve greater flexibility than ASIC devices by adding more programmability to the application specific hardware and by introducing instruction-set processors to the hardware. However, since ASIPs are general-purpose devices, their processor core efficiency depends on the application being processed. The more control code in the application, the less efficient the ASIP will be. This results in poor performance and higher power consumption.

Additional disadvantages of the prior art processors are scalability and modularity. The software-defined radio (SDR) approach was created in order to minimize cost (design time, TTM) and power consumption and to maximize flexibility. The prior art processor implementations fail to provide an optimized combination of scalability and modularity.

The performance of a processor may also be greatly impacted by the interconnects used to couple together the logical units in a processor. In configurable data processing devices, several multi-bit buses may be used to couple a group of output interfaces to a group of input interfaces. For instance, N input interfaces and M output interfaces may be programmably connected using B data buses, where the B data buses may have the same number of bit lines (e.g., all 16 bit buses), or different numbers of bit lines (e.g., 8-bit, 16-bit, 32-bit and 64-bit buses). An input interface and an output interface may be associated with the same functional unit. For instance, an accumulator may have a 32-bit input interface coupled to a first bus and a 32-bit output interface coupled to a second bus.

However, in order to maintain maximum flexibility in a reconfigurable architecture, conventional configurable processors typically use a global (i.e., inter-processor) M×N multi-bus crossbar switch interconnect that enables each one of the input interfaces to be connected to each one of the interconnection buses and also enables each one of the output interfaces to be connected to each one of the interconnection buses. The disadvantage of the global M×N multi-bus crossbar switch interconnect is the high power consumption. Since all buses are connectable to all input and output interfaces, a large number of switches must be provided in order to allow every input to be connected to every output. The large number of switches greatly increases the capacitance on each bit line, thereby increasing the power required to drive the bus. High power consumption is not suitable for a mobile handset.

Therefore, there is a need in the art for an improved software-defined radio (SDR) architecture that minimizes cost and power consumption while maintaining flexibility. In particular, there is a need for an improved interconnect for use in software-defined radio (SDR) wireless devices.

SUMMARY OF THE INVENTION

The present invention introduces a unified approach to designing global and local interconnects in a data processor such that the interconnect of the architecture at macro-scale (inter-processor) and at micro-scale (intra-processor) has the same basic structure. The new bus structure is an M×N multi-bus crossbar switch with a minimal number of programmable switches. The number and position of the programmable switches is not fixed a-priori but is application-dependent and is determined via architecture exploration. The invention is implemented in data processors with coarse-grained functional units connected by the local interconnects, unlike the fine-grained functional units of prior art architectures, thereby minimizing bus traffic and power consumption.

To address the above-discussed deficiencies of the prior art, it is a primary object of the present invention to provide a reconfigurable integrated circuit capable of being configured in P possible configurations associated with a defined function. According to an advantageous embodiment of the present invention, the reconfigurable integrated circuit comprises: 1) a plurality of reconfigurable component circuit blocks; 2) B data buses; 3) N input interfaces associated with the plurality of reconfigurable component circuit blocks, each of the N input interfaces capable of being selectively coupled to the B data buses; and 4) a first plurality of programmable switches, wherein each of the first plurality of programmable switches couples one of the N input interfaces to one of the B data buses only if required to implement at least one of the P possible configurations.

According to one embodiment of the present invention, the reconfigurable integrated circuit further comprises: 5) M output interfaces associated with the plurality of reconfigurable component circuit blocks, each of the M output interfaces capable of being selectively coupled to the B data buses; and 6) a second plurality of programmable switches, wherein each of the second plurality of programmable switches couples one of the M output interfaces to one of the B data buses only if required to implement at least one of the P possible configurations.

It is another primary object of the present invention to provide a method of fabricating an interconnect circuit for coupling a plurality of reconfigurable component blocks that are capable of being configured to implement a defined function. According to an advantageous embodiment of the present invention, the method comprises the steps of: 1) determining P possible configurations for implementing the defined function; 2) for each of the P possible configuration, determining a list of required interconnections between the plurality of reconfigurable component blocks; 3) determining from the P lists of required interconnections a minimum number, B, of data buses required to implement the P possible configurations for the defined function; 4) for each of the P possible configurations, determining the interconnections of each of the plurality of reconfigurable component blocks to each of the B buses; and 5) implementing programmable switches capable of coupling a first reconfigurable component block to a first bus only if required to implement at least one of the P possible configurations.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present invention and its advantages, reference is now made to the following description taken in conjunction with the accompanying drawings, in which like reference numerals represent like parts:

FIG. 2 illustrates a finite state machine (FSM) table for a data processor;

DETAILED DESCRIPTION OF THE INVENTION

FIGS. 1 through 9, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged software-defined radio (SDR) system.

Figure 1:
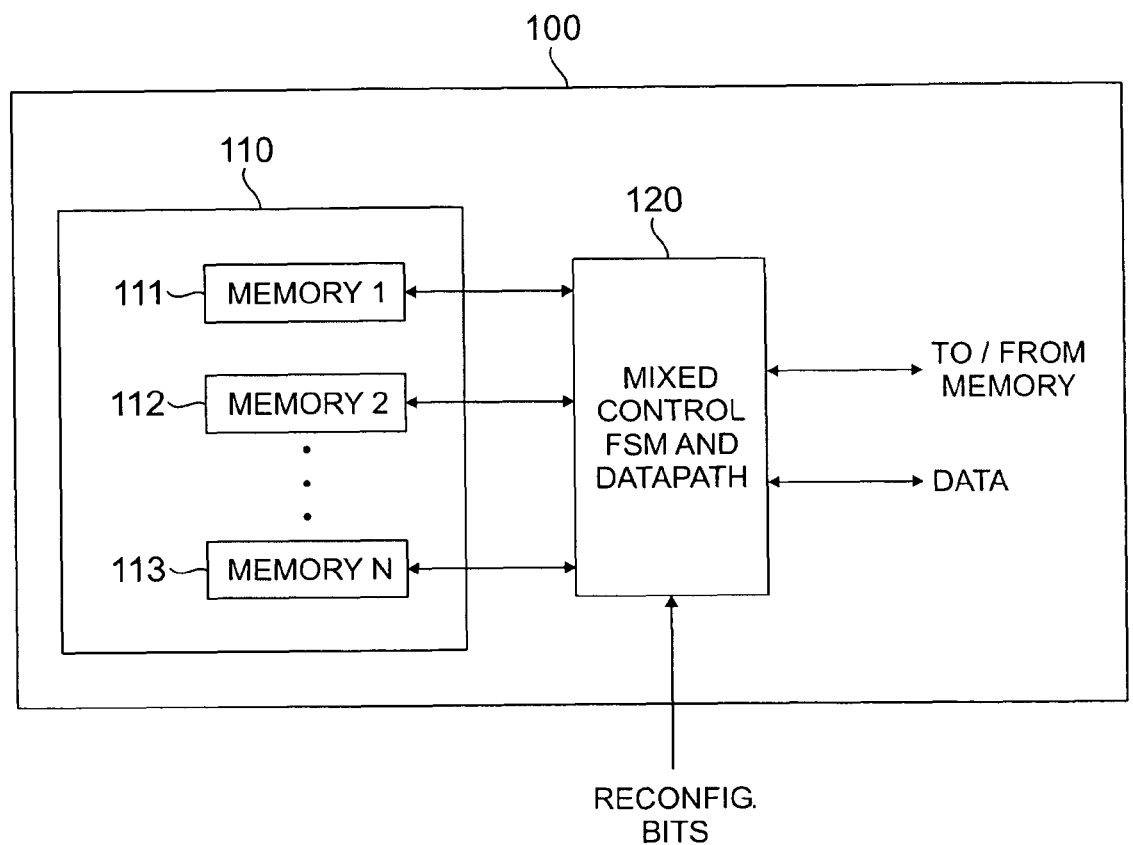
FIG. 1 is a block diagram of a conventional data processor according to an exemplary embodiment of the prior art.

FIG. 1 is a high-level block diagram of conventional data processor 100 according to an exemplary embodiment of the prior art. FIG. 1 depicts a general implementation of an application in hardware and software. Data processor 100 comprises memory 110 and control circuitry 120. Control circuitry 120 further comprises mixed control finite state machine (FSM) circuitry and datapath circuitry. Memory 110 further comprises N memory blocks, including exemplary memory blocks 111-113, which are arbitrarily labeled Memory 1, Memory 2, and Memory N.

Any data processor application may be regarded as a set of datapaths controlled and scheduled by a finite state machine (FSM), as FIG. 1 shows. A finite state machine receives input events and, in response, transitions between states and/or generates outputs. The FSM decides to which states to transition based on the current state and the received input events.

FIG. 2 illustrates finite state machine (FSM) table 200 for an exemplary data processor. FSM table 200 depicts the next state transitions performed by a FSM based on the current state (i.e., one of states S1-S10) and the received input event (i.e., one of events E1-E7). Initially, the FSM is in state S1. The column for state S1 indicates the state transitions for state S1 in response to events E1-E4.

In response to event E1 received during state S1, the FSM transitions from state S1 to state S9. In response to event E2 received during state S1, the FSM transitions from state S1 to state S2. In response to event E3 received during state S1, the FSM transitions from state S1 to state S2. In response to event E4 received during state S1, the FSM transitions from state S1 to state S10.

As FIG. 2 makes clear, there are many holes in the FSM table 200 for which no values are given. For example, for state S1, no values are given for events E5-E7. In prior art data processors, those holes, although they do not contribute to the flow of the finite state machine, must be provided for, otherwise the finite state machine will not work correctly. In the prior art data processors, the finite state machines cannot be further optimized to eliminate these holes.

Figure 3:
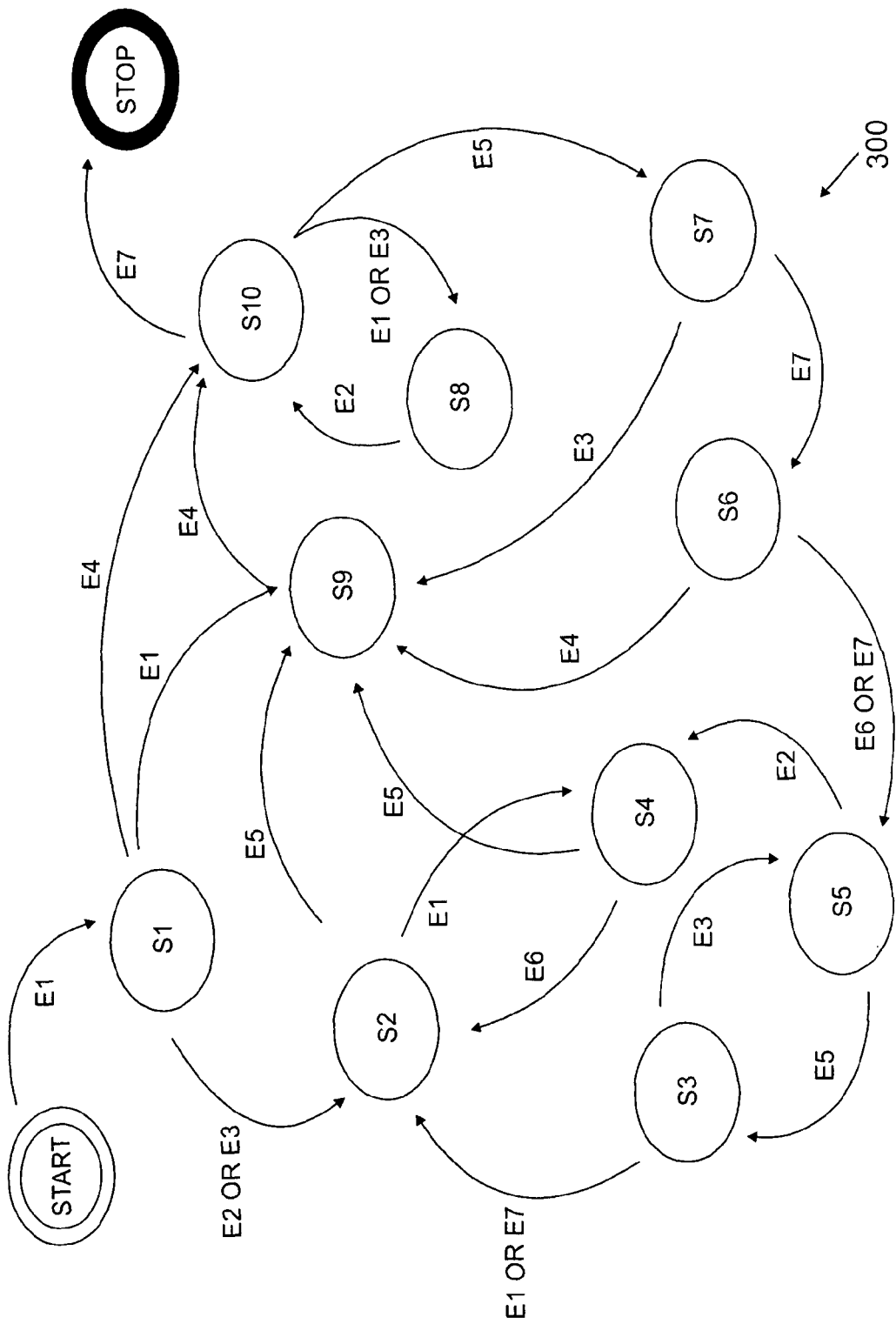
FIG. 3 is a bubble diagram corresponding to the finite state machine table in FIG. 2.

FIG. 3 illustrates bubble diagram 300, which corresponds to the finite state machine table in FIG. 2. Each of states S1-S10 is represented by a bubble and events E1-E7 cause transitions between states. These transitions are represented by the arrowed lines connecting the state bubbles. The arrowhead determines the direction of the transition.

Figure 4:
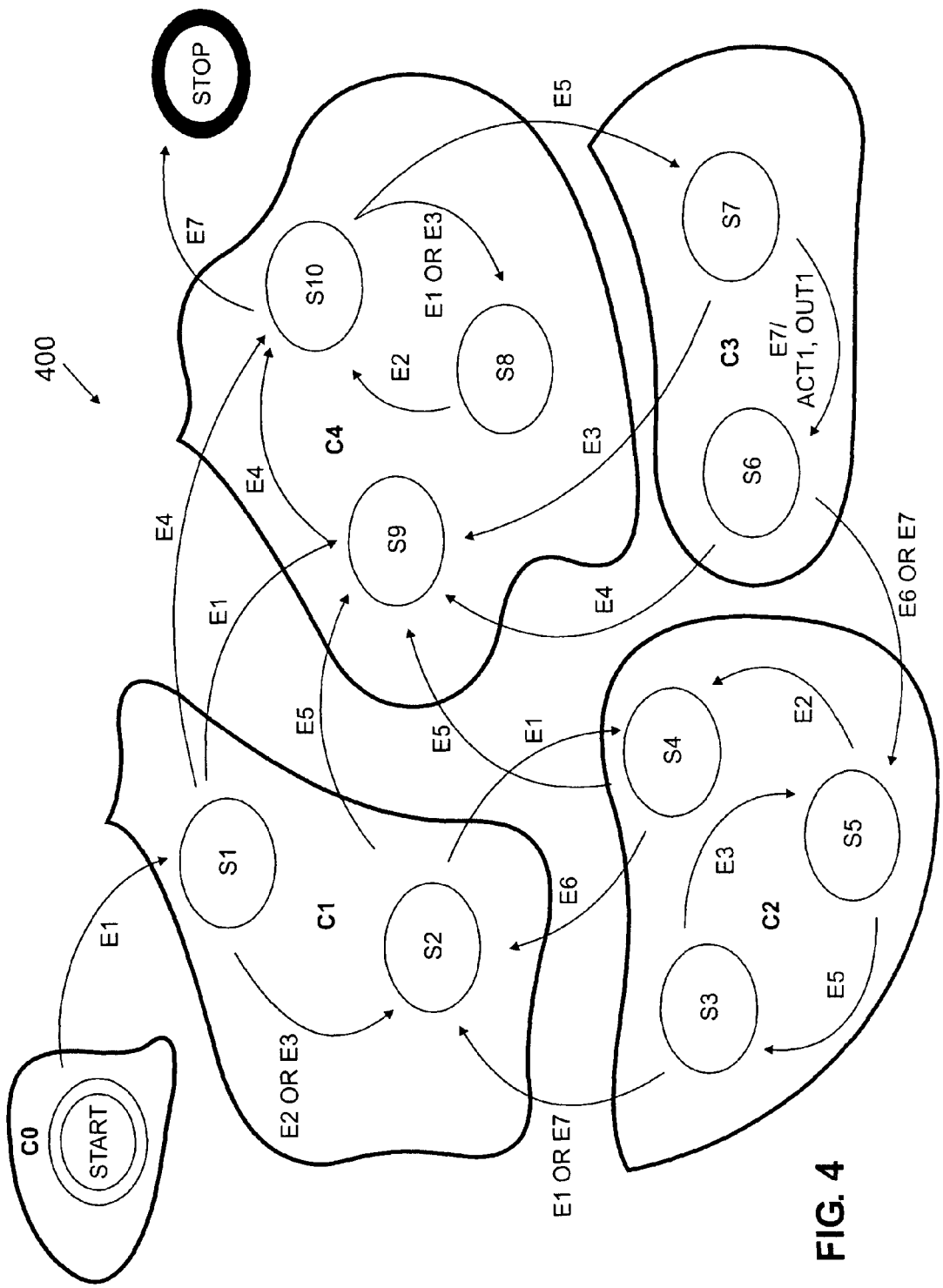
FIG. 4 is a bubble diagram showing context-based groupings of states in the finite state machine table in FIG. 2 according to an exemplary embodiment of the present invention.

It is noted that in bubble diagram 300, it is possible to group states according to contexts of execution units. For the purposes of this disclosure, a context is a group of operations and/or instructions that are related to the same function. FIG. 4 illustrates bubble diagram 400, in which states of the finite state machine table in FIG. 2 that are related to the same context are grouped together according to the principles of the present invention. The groupings of states form contexts C0, C1, C2, C3 and C4.

Each of the groupings of states in FIG. 4 may be used to create a context-based operation reconfigurable instruction set processor (CRISP) according to the principles of the present invention. Each of contexts C0-C4 comprises a minimum number of input events and a set of probable operations. Each context also has its own data path, which may comprise parallel execution units while the instruction set execution may be either in a VLIW, SIMD, microcode or other known implementation manner to increase the overall performance.

Figure 5:
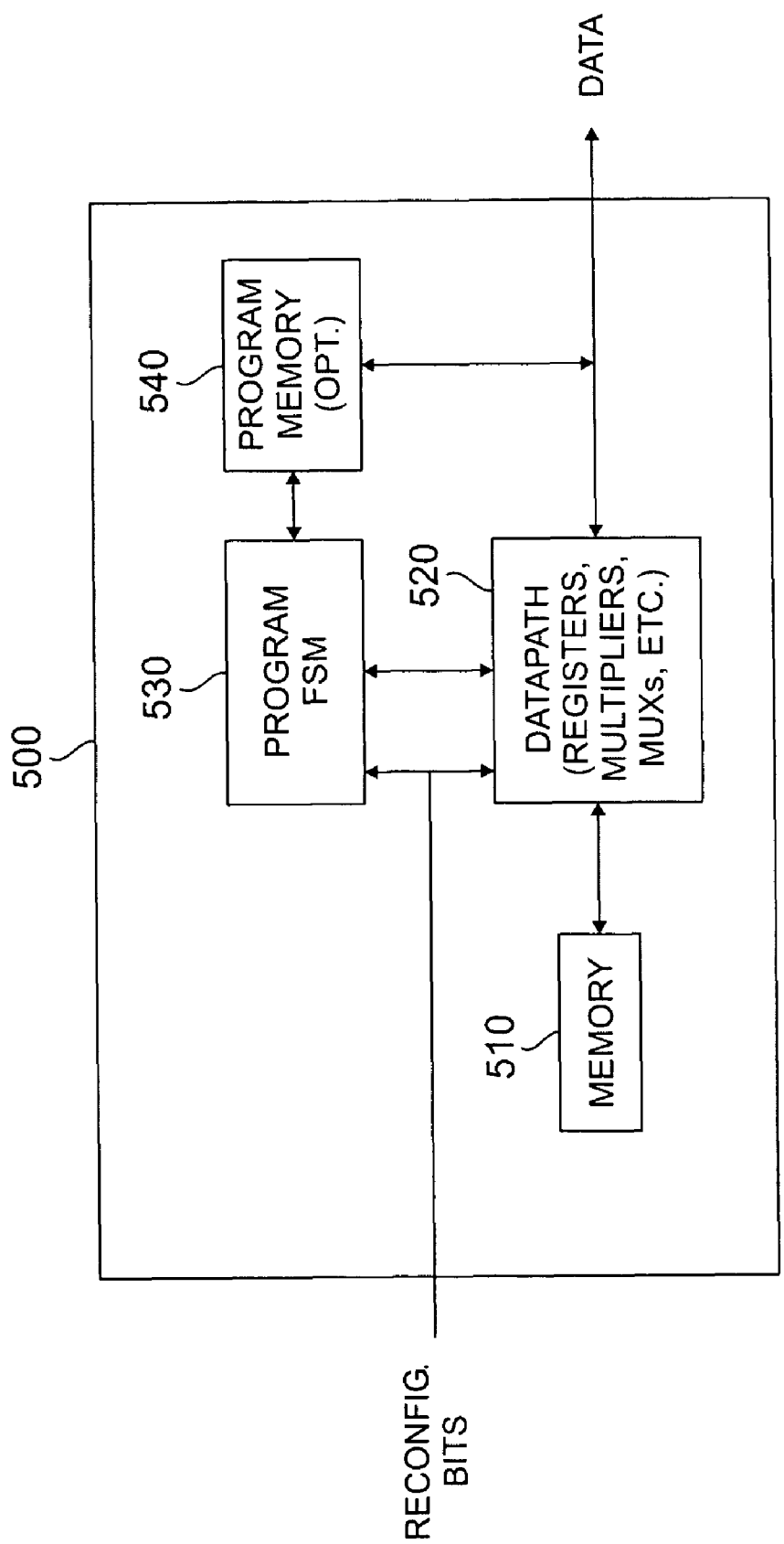
FIG. 5 is a high-level block diagram of a context-based operation reconfigurable instruction set processor according to an exemplary embodiment of the present invention.

FIG. 5 is a high-level block diagram of context-based operation reconfigurable instruction set processor (CRISP) 500, according to an exemplary embodiment of the present invention. CRISP 500 comprises memory 510, programmable data path circuitry 520, programmable finite state machine 530, and optional program memory 540. CRISP 500 is designed to implement only a subset of context-related instructions from FIG. 4 in an optimum manner. Each of the contexts C0-C4 in FIG. 4 may be implemented by a separate CRISP similar to CRISP 500. Context-based operation reconfigurable instruction set processor (CRISP) 500 defines the generic hardware block that usually consists of higher level hardware processor blocks. The principle advantage to CRISP 500 is that CRISP 500 breaks down the required application into two main domains, a control domain and a data path domain, and optimize each domain separately. By implementing a data processor application, such as a mobile station handset (e.g., cell phone, wireless laptop), using CRISP 500, the present invention at least partially overcomes the flexibility vs. power problems that adversely affect conventional data processor applications.

The control domain is implemented by programmable finite state machine 530, which may comprise a DSP, an MCU or another prior art device. Programmable FSM 530 is configured by reconfiguration bits received from an external controller (not shown). Programmable FSM 530 may execute a program stored in associated optional program memory 540. The program may be stored in program memory 540 via the DATA line from an external controller (not shown). Memory 510 is used to store application data used by data path circuitry 520.

Programmable data path circuitry 520 is divided into a set of building blocks that perform particular functions (e.g., registers, multiplexers, multipliers, and the like). Each of building blocks is both reconfigurable and programmable to allow maximum flexibility. The criteria for dividing programmable data path circuitry 520 into functional blocks depends on the level of reconfigurability and programmability required for a particular application.

Since each of the contexts C0-C4 in FIG. 4 is implemented by a separate CRISP 500 that works independently of other CRISPs, the present invention provides an efficient power management scheme that is able to shut down a CRISP when the CRISP is not required to execute. This assures that only the CRISPs that are needed at a given time are active, while other idle CRISPs do not consume any significant power.

A CRISP according to the principles of the present invention may be targeted to many applications, including, but not limited to, baseband applications in wireless devices and multimedia applications. In many applications, these contexts may be loosely-coupled independent contexts that may run concurrently with either minimum or no dependencies.

Figure 6:
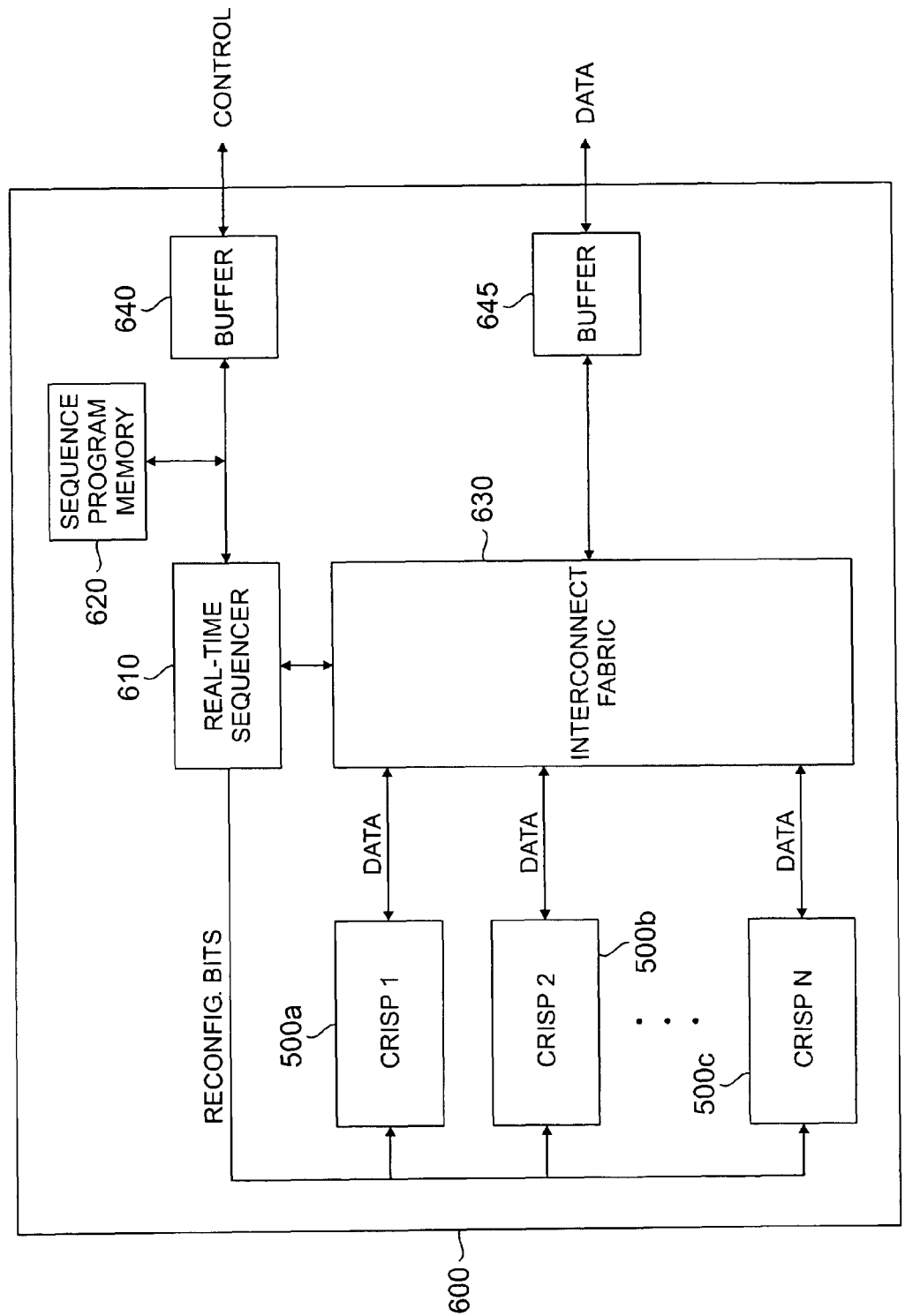
FIG. 6 is a high-level block diagram of a reconfigurable processing system comprising a plurality of context-based operation reconfigurable instruction set processors according to an exemplary embodiment of the present invention.

FIG. 6 is a high-level block diagram of reconfigurable processing system 600 according to an exemplary embodiment of the present invention. Reconfigurable processing system 600 comprises N context-based operation reconfigurable instruction set processors (CRISPs), including exemplary CRISPs 500a, 500b, and 500c, which are arbitrarily labeled CRISP 1, CRISP 2 and CRISP N. Reconfigurable processing system 600 further comprises real-time sequencer 610, sequence program memory 620, programmable interconnect fabric 630, and buffers 640 and 645.

Reconfiguration bits may be loaded into CRISPs 500a, 500b, and 500c from the CONTROL line via real-time sequencer 610 and buffer 640. A control program may also be loaded into sequence program memory 620 from the CONTROL line via buffer 640. Real-time sequencer sequences the contexts to be executed by each one of CRISPs 500a-c by retrieving program instructions from program memory 620 and sending reconfiguration bits to CRISPs 500a-c. In an exemplary embodiment, real-time sequencer 610 may comprise a stack processor, which is suitable to operate as a real-time scheduler due to its low latency and simplicity.

Reconfigurable interconnect fabric 630 provides connectively between each one of CRISPs 500a-c and an external DATA bus via bi-directional buffer 645. In an exemplary embodiment of the present invention, each one of CRISPs 500a-c may act as a master of reconfigurable interconnect fabric 630 and may initiate address access. The bus arbiter for reconfigurable interconnect fabric 630 may be internal to real-time sequencer 610.

In an exemplary embodiment, reconfigurable processing system 600 may be, for example, a cell phone or a similar wireless device, or a data processor for use in a laptop computer. In a wireless device embodiment implemented according to a software-defined radio (SDR) principles, each one of CRISPs 500a-c is responsible for executing a subset of context-related instructions that are associated with a particular reconfigurable function. For example, CRISP 500a may be configured to execute context-related instructions that process CDMA baseband signals or OFDMA baseband signals. CRISP 500b may be configured to execute context-related instructions that act as a memory controller. CRISP 500c may be configured to execute context-related instructions that perform MPEG-4 processing for multimedia applications.

A CRISP according to the principles of the present invention provides a new way of implementing reconfigurable hardware acceleration techniques. The present invention provides reconfigurability and programmability with minimum sacrifice on power efficiency. Since the CRISPs are largely independent and may be run simultaneously, the present invention has the performance advantage of parallelism without incurring the full power penalty associated with running parallel operations. The loose coupling and independence of CRISPs allows them to be configured for different systems and functions that may be shut down separately.

Figure 7:
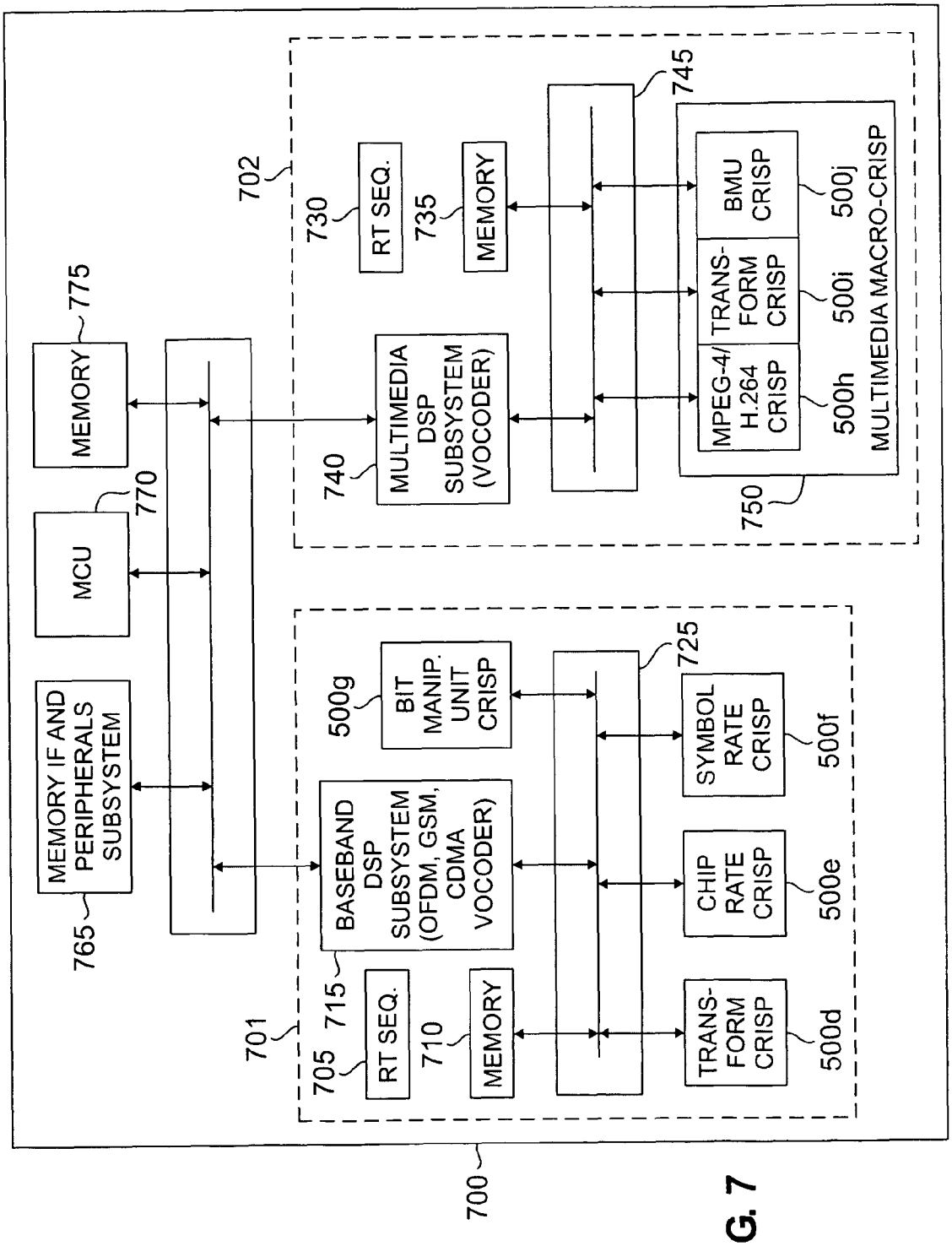
FIG. 7 is a high-level block diagram of a multi-standard software-defined radio (SDR) system comprising a plurality of context-based operation reconfigurable instruction set processors according to one embodiment of the present invention.

FIG. 7 is a high-level block diagram of multi-standard software-defined radio (SDR) system 700, which comprises a plurality of context-based operation reconfigurable instruction set processors according to one embodiment of the present invention. SDR system 700 may comprise a wireless terminal (or mobile station) that accesses a wireless network, such as, for example, a GSM or CDMA cellular telephone, a PDA with WCDMA or IEEE-802.11x capabilities, or the like.

Multi-standard SDR system 700 comprises baseband subsystem 701, applications subsystem 702, memory interface (IF) and peripherals subsystem 765, main control unit (MCU) 770, memory 775, and interconnect 780. MCU 770 may comprise, for example, a conventional microcontroller or a microprocessor (e.g., x86, ARM, RISC, DSP, etc.). Memory IF and peripherals subsystem 765 may connect SDR system 700 to an external memory (not shown) and to external peripherals (not shown). Memory 775 stores data from other components in SDR system 700 and from external devices (not shown). For example, memory 775 may store a stream of incoming data samples received from an external antenna system and an RF down-converter associated with SDR system 700. Interconnect 780 provides data transfer between subsystems 701 and 702, memory IF and peripherals subsystem 765, MCU 770, and memory 775.

Baseband subsystem 701 comprises real-time (RT) sequencer 705, memory 710, baseband DSP subsystem 715, interconnect 725, and a plurality of special purpose context-based operation instruction set processors (CRISPs), including transform CRISP 500d, chip rate CRISP 500e, symbol rate CRISP 500f, and bit manipulation unit (BMU) CRISP 500g. By way of example, transform CRISP 500d may implement a Fast Fourier Transform (FFT) function, chip rate CRISP 500e may implement a correlation function for a CDMA signal, and symbol rate CRISP 500f may implement a Viterbi decoder function.

In such an exemplary embodiment, transform CRISP 500d may receive samples of an intermediate frequency (IF) signal stored in memory 775 and perform an FFT function that generates a sequence of chip samples at a base band rate. Next, chip rate CRISP 500e receives the chip samples from transform CRISP 500d and performs a correlation function that generates a sequence of data symbols. Next, symbol rate CRISP 500f receives the symbol data from chip rate CRISP 500e and performs Viterbi decoding to recover the baseband user data. The baseband user data may then be used by applications subsystem 702.

In an exemplary embodiment of the present invention, symbol rate CRISP 500f may comprise two or more CRISPs that operate in parallel. Also, by way of example, BMU CRISP 500g may implement such functions as variable length coding, cyclic redundancy check (CRC), convolutional encoding, and the like. Interconnect 725 provides data transfer between RT sequencer 705, memory 710, baseband DSP subsystem 715 and CRISPs 500d-500g.

Applications subsystem 702 comprises real-time (RT) sequencer 730, memory 735, multimedia DSP subsystem 740, interconnect 745, and multimedia macro-CRISP 750. Multimedia macro-CRISP 750 comprises a plurality of special purpose context-based operation instruction set processors, including MPEG-4/H.264 CRISP 550h, transform CRISP 550i, and BMU CRISP 500j. IN an exemplary embodiment of the present invention, MPEG-4/H.264 CRISP 550h performs motion estimation functions and transform CRISP 500h performs a discrete cosine transform (DCT) function. Interconnect 780 provides data transfer between RT sequencer 730, memory 735, multimedia DSP subsystem 740, and multimedia macro-CRISP 750.

In the exemplary embodiment shown in FIG. 7, the use of CRISP devices enables applications subsystem 702 of multi-standard SDR system 700 to be reconfigured to support multiple video standards with multiple profiles and sizes. Additionally, the use of CRISP devices enables baseband subsystem 701 of multi-standard SDR system 700 to be reconfigured to support multiple air interface standards. Thus, SDR system 700 is able to operate in different types of wireless networks (e.g., CDMA, GSM, 802.11x, etc.) and can play different types of video and audio formats. However, the use of CRISPS according to the principles of the present invention enables SDR system 700 to perform these functions with much lower power consumption than conventional wireless devices having comparable capabilities.

As noted above, the interconnects in a re-configurable processing device may affect power consumption due to the large capacitance caused by the many programmable switches that selectively connect input interfaces to particular buses and selectively connect output interfaces to particular buses. In a general-purpose re-configurable processor in which all functions are performed by the same re-configurable hardware, all input interfaces and output interfaces must be connectable to all buses. This is because, for the $i^{th}$ input interface, there will always be at least one application that will require the $i^{th}$ interface to be connected to the $k^{th}$ output interface. In order to cover all possible combinations required by all possible applications, every input interface and every output interface must be able to be connected to every bus.

However, because a CRISP according to the principles of the present invention only performs a particular type of function (i.e., correlation, decoding, transform, etc.), a CRISP only executes a subset of the total operations (i.e., instruction set) performed by a processing device. Thus, it is possible that many of the functional blocks within a CRISP or between CRISPs may not ever be coupled to certain other ones of the functional blocks. As a result, it is possible to design a customized interconnect for use in a particular CRISP or between particular CRISPs. A customized interconnect according to the principles of the present invention provides programmable switches between only some of the input interfaces and some of the buses and between only some of the output interfaces and some of the buses.

Figure 8:
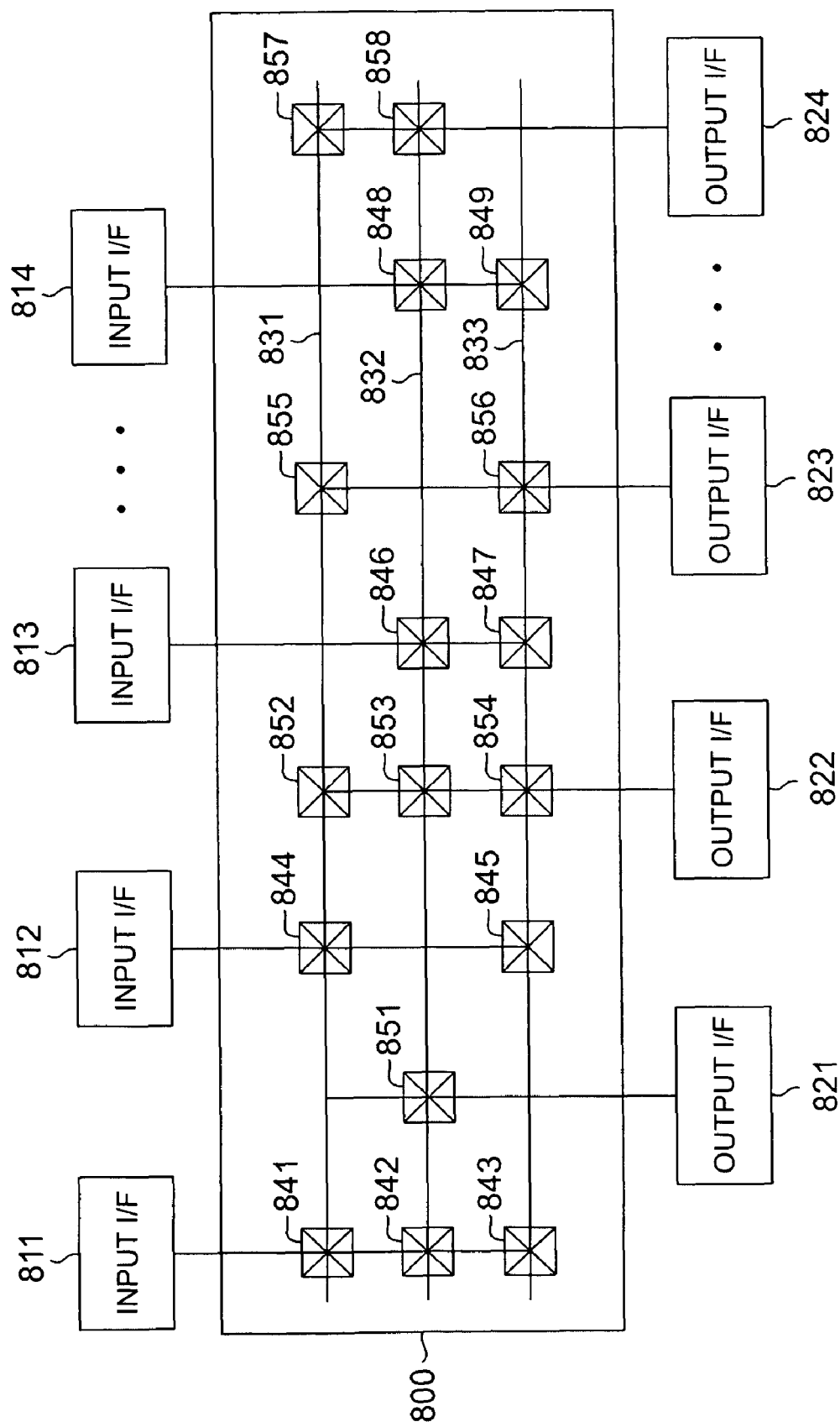
FIG. 8 illustrates an exemplary interconnect according to the principles of the present invention.

FIG. 8 illustrates exemplary interconnect 800 according to the principles of the present invention. Interconnect 800 may be implemented as, for example, one or more of interconnects 725, 745 or 780 in FIG. 7. Interconnect 800 also may be implemented within a CRISP, such as within CRIPS 500e or 500f in FIG. 7. Interconnect 800 comprises B data buses and a plurality of programmable switches that are used to couple N input interfaces to M output interfaces. In the illustrated example, interconnect 800 comprises bus 831, bus 832, and bus 833, so that B=3. Each one of buses 831-833 may be a multi-bit bus. The number of bit lines in each bus may be the same or different. For example, buses 831 and 832 may be 32-bit buses, while bus 833 may be a 64-bit bus.

The N input interfaces include exemplary input interfaces 811-814. The M output interfaces include exemplary output interfaces 821-824. As FIG. 8 illustrates, only some of input interfaces 811-814 are capable of being coupled to some of buses 831-833. Input interface 811 may be coupled to buses 831, 832 and 833 by programmable switches 841, 842 and 843, respectively. Input interface 812 may be coupled to buses 831 and 833 by programmable switches 844 and 845, respectively. Input interface 813 may be coupled to buses 832 and 833 by programmable switches 846 and 847, respectively. Input interface 814 may be coupled to buses 832 and 833 by programmable switches 848 and 849, respectively.

Similarly, output interface 821 may be coupled to bus 832 only by programmable switch 851. Output interface 822 may be coupled to buses 831, 832 and 833 by programmable switches 852, 853 and 854, respectively. Output interface 823 may be coupled to buses 831 and 833 by programmable switches 855 and 856, respectively. Output interface 824 may be coupled to buses 831 and 832 by programmable switches 857 and 858, respectively.

However, input interface 812 cannot be coupled to bus 832, input interface 813 cannot be coupled to bus 831, and input interface 814 cannot be coupled to bus 831, because programmable switches are not provided at the junctures between those input interfaces and buses. Likewise, output interface 821 cannot be coupled to buses 831 and 833, output interface 823 cannot be coupled to bus 832, and output interface 824 cannot be coupled to bus 833, because programmable switches are not provided at the junctures between those output interfaces and buses.

Advantageously, this omission of programmable switches between some bus lines and some output and input interfaces reduces capacitance on the driving device and reduces power consumption. For example, the output lines of output interface 821 drive only the capacitances caused by programmable switches 851. There are no unnecessary programmable switches for coupling the output lines of output interface 821 to either bus 331 or bus 833. Programmable switches are not provided between output interface 821 and either bus 331 or bus 833 because, during the design of the CRISP, it was determined that the particular function performed by the CRISP would never require output interface 821 to be coupled to either bus 331 or bus 833. By contrast, a conventional reconfigurable processor would provide programmable switches between the output lines of output interface 821 and both of bus 331 and bus 833.

Figure 9:
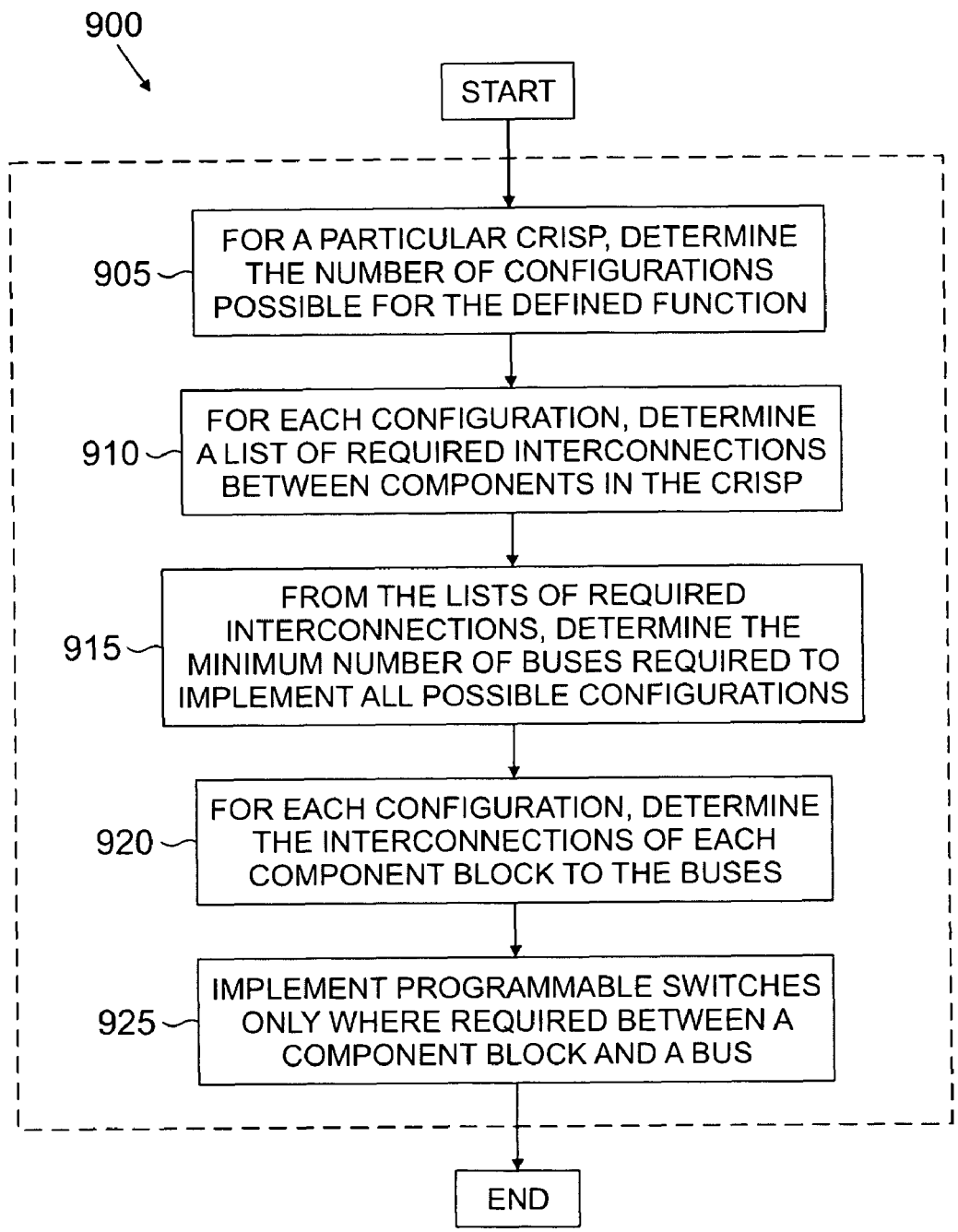
FIG. 9 is a flow diagram illustrating the method of designing an interconnect for an SDR system according to the principles of the present invention.

FIG. 9 depicts flow diagram 900, which illustrates a method of determining exemplary interconnect 800 for use in SDR system 700 according to the principles of the present invention. Initially, for a particular CRISP (or group of CRISPs), the number of configurations possible for the defined function is determined (process step 905). For example, for chip rate CRISP 500e, it is determined how may configurations of the correlation function (i.e., CDMA, WCDMA, etc.) will be implemented. For each configuration, a list of required interconnections between the component circuit blocks within the CRISP (or between CRISPs) is determined (process step 910).

Next, from the lists of required interconnections, the minimum number of buses required to implement all possible configurations is determined (process step 915). For each configuration, the interconnections of each component block to the buses are determined (process step 920). Finally, programmable switches are implemented in interconnect 800 only where required between a component block and a bus (process step 925).

Although the present invention has been described with an exemplary embodiment, various changes and modifications may be suggested to one skilled in the art. It is intended that the present invention encompass such changes and modifications as fall within the scope of the appended claims.

What is claimed is:

1. A method of fabricating an interconnect circuit for coupling a plurality of context-based reconfigurable instruction set processors (CRISPs) that are reconfigurable within a context to implement at least one defined function, the context defining a group of operations related to a function, the method comprising the steps of:

determining, by at least one of the plurality of CRISPS, P possible configurations for implementing the at least one defined function;

for each of the P possible configurations, determining a list of required interconnections between the plurality of CRISPS;

determining from the P lists of required interconnections a minimum number, B, of data buses required to implement the P possible configurations for the at least one defined function;

for each of the P possible configurations, determining the interconnections of each of the plurality of CRISPs to each of the B buses; and implementing programmable switches capable of coupling a first CRISP to a first bus only if required to implement at least one of the P possible configurations, wherein two or more of the CRISPS in the interconnect circuit are used to implement the at least one of the P possible configurations, wherein at least one other function is implemented in the interconnect circuit, and wherein power may be selectively applied to either one or both of the at least one defined function and the at least one other function.

2. The method as set forth in claim 1, wherein the defined function is a correlation function.

3. The method as set forth in claim 1, wherein the defined function is a signal decoding function.

4. The method as set forth in claim 1, wherein the defined function is a Viterbi signal decoding function.

5. The method as set forth in claim 1, wherein the defined function is a signal transform function.

6. The method as set forth in claim 1, wherein the defined function is a Fast Fourier transform function.

7. The method as set forth in claim 1, wherein the defined function is a baseband signal processing function.

8. A reconfigurable integrated circuit configurable in P possible configurations associated with a defined function, said reconfigurable integrated circuit comprising:

a plurality of context-based reconfigurable instruction set processors (CRISPS), each of said plurality of CRISPS reconfigurable based on a context, the context comprising a group of operations related to a function;

B data buses;

N input interfaces associated with said plurality of CRISPs, each of said N input interfaces selectively coupled to said B data buses; and a first plurality of programmable switches, wherein each of said first plurality of programmable switches couples one of said N input interfaces to one of said B data buses only if required to implement a first P configuration associated with a first function and a second P configuration associated with a second function, and wherein power is selectively applied to either one or both of the first function and the second function.

9. The reconfigurable integrated circuit as set forth in claim 8, further comprising:

M output interfaces associated with said plurality of CRISPs, each of said M output interfaces selectively coupled to said B data buses; and a second plurality of programmable switches, wherein each of said second plurality of programmable switches couples one of said M output interfaces to one of said B data buses only if required to implement at least one of said P possible configurations.

10. The reconfigurable integrated circuit as set forth in claim 8, wherein the defined function is a correlation function.

11. The reconfigurable integrated circuit as set forth in claim 8, wherein the defined function is a signal decoding function.

12. The reconfigurable integrated circuit as set forth in claim 8, wherein the defined function is a Viterbi signal decoding function.

13. The reconfigurable integrated circuit as set forth in claim 8, wherein the defined function is a signal transform function.

14. The reconfigurable integrated circuit as set forth in claim 8, wherein the defined function is a Fast Fourier transform function.

15. The reconfigurable integrated circuit as set forth in claim 8, wherein the defined function is a baseband signal processing function.

16. The reconfigurable integrated circuit as set forth in claim 8, wherein the reconfigurable integrated circuit is implemented in a software-defined radio system.

17. The reconfigurable integrated circuit as set forth in claim 16, wherein the reconfigurable integrated circuit comprises a baseband signal processing subsystem in said software-defined radio system.

18. The reconfigurable integrated circuit as set forth in claim 16, wherein the reconfigurable integrated circuit comprises an application layer processing subsystem in said software-defined radio system.

19. The reconfigurable integrated circuit as set forth in claim 8, wherein at least one of the plurality of CRISPS is configured to implement a subset of the group of operations.

20. A reconfigurable integrated circuit configurable in P possible configurations associated with a defined function, said reconfigurable integrated circuit comprising:

a plurality of context-based reconfigurable instruction set processors (CRISPS), each of said plurality of CRISPS reconfigurable based on a context, the context comprising a group of operations related to a function, wherein a first of the plurality of CRISPS is configured to perform a first subset of the group of operations related to the function and a second of the plurality of CRISPS is configured to perform a second subset of the group of operations related to the function;

B data buses;

N input interfaces associated with said plurality of CRISPs, each of said N input interfaces selectively coupled to said B data buses; and a first plurality of programmable switches, wherein each of said first plurality of programmable switches couples one of said N input interfaces to one of said B data buses only if required to implement a first P configuration associated with a first function and a second P configuration associated with a second function, and wherein power is selectively applied to either one or both of the first function and the second function.

* * * * *

UNITED STATES PATENT AND TRADEMARK OFFICE
CERTIFICATE OF CORRECTION

| | | |
|---|---|---|
| PATENT NO. | : 7,856,611 B2 | Page 1 of 1 |
| APPLICATION NO. | : 11/142484 | |
| DATED | : December 21, 2010 | |
| INVENTOR(S) | : Eran Pisek et al. | |

It is certified that error appears in the above-identified patent and that said Letters Patent is hereby corrected as shown below:

Column 11, claim 1, line 21, delete "may be" and replace with --is--.

Signed and Sealed this
Twenty-fourth Day of May, 2011

David J. Kappos
*Director of the United States Patent and Trademark Office*